United States Patent [19]
Hirano et al.

[11] Patent Number: 5,270,266
[45] Date of Patent: Dec. 14, 1993

[54] METHOD OF ADJUSTING THE TEMPERATURE OF A SEMICONDUCTOR WAFER

[75] Inventors: Yoshihisa Hirano; Yoshifumi Tahara; Isahiro Hasegawa; Keiji Horioka, all of Tokyo, Japan

[73] Assignee: Tokyo Electron Limited, Tokyo, Japan

[21] Appl. No.: 988,669

[22] Filed: Dec. 10, 1992

[30] Foreign Application Priority Data

Dec. 13, 1991 [JP] Japan .................................. 3-352073

[51] Int. Cl.$^5$ .......................................... H01L 21/465
[52] U.S. Cl. ..................................... 437/228; 437/248; 148/DIG. 50; 156/345; 156/625; 156/646; 118/724
[58] Field of Search ................. 156/345, 625, 646; 118/724; 437/20, 228, 248; 361/233; 148/DIG. 50

[56] References Cited

U.S. PATENT DOCUMENTS

| | | | |
|---|---|---|---|
| 4,261,762 | 4/1981 | King | 437/20 |
| 4,384,918 | 5/1983 | Abe | 156/345 |
| 4,457,359 | 7/1984 | Holden . | |
| 4,508,161 | 4/1985 | Holden . | |
| 4,512,391 | 4/1985 | Harra . | |
| 4,615,755 | 10/1986 | Tracy et al. . | |
| 4,771,730 | 9/1988 | Tezuka | 118/724 |
| 4,842,683 | 6/1989 | Cheng et al. | 156/345 |
| 4,931,135 | 6/1990 | Horiuchi et al. | 156/345 |
| 4,949,783 | 8/1990 | Lakios et al. | 118/724 |
| 4,963,713 | 10/1993 | Horiuchi et al. | 156/646 |

FOREIGN PATENT DOCUMENTS

| | | | |
|---|---|---|---|
| 02-98957 | 4/1990 | Japan | 437/248 |
| 2-143440 | 6/1990 | Japan | 437/248 |

OTHER PUBLICATIONS

Sieradzki, Nuclear Instruments and Methods in Physics Research B6, 1985, pp. 237-242. "Air-Enhanced contact cooling of wafers".

Primary Examiner—Olik Chaudhuri
Assistant Examiner—Ramamohan Rao Paladugu
Attorney, Agent, or Firm—Oblon, Spivak, McClelland, Maier & Neustadt

[57] ABSTRACT

A method of adjusting the temperature of a semiconductor wafer comprising mounting and attracting the wafer on a susceptor in a process chamber, exhausting and decompressing the process chamber, controlling the temperature of the wafer to become equal to a process temperature while cooling or heating the susceptor, supplying process gas into the chamber to process the wafer with this process gas, and introducing $CF_4$ gas into interstices between the wafer and the susceptor through the susceptor to allow heat exchange to be achieved between them. $CF_4$ gas includes same components as at least some of those of the process gas and it is more excellent in heat transmitting characteristic than helium gas. Even when $CF_4$ gas is leaked into a process area, therefore, any influence is not added to the process.

10 Claims, 8 Drawing Sheets

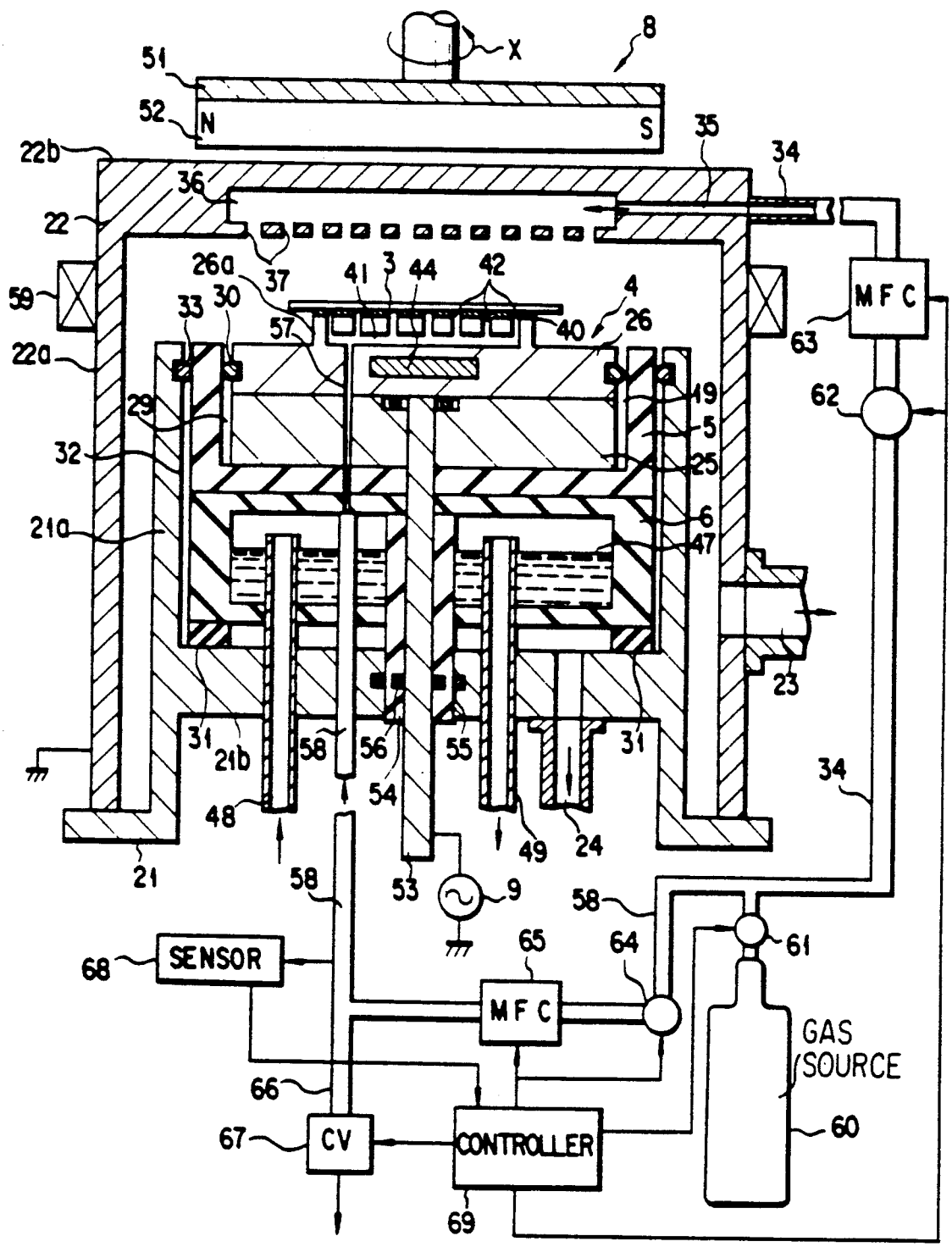
F I G. 1

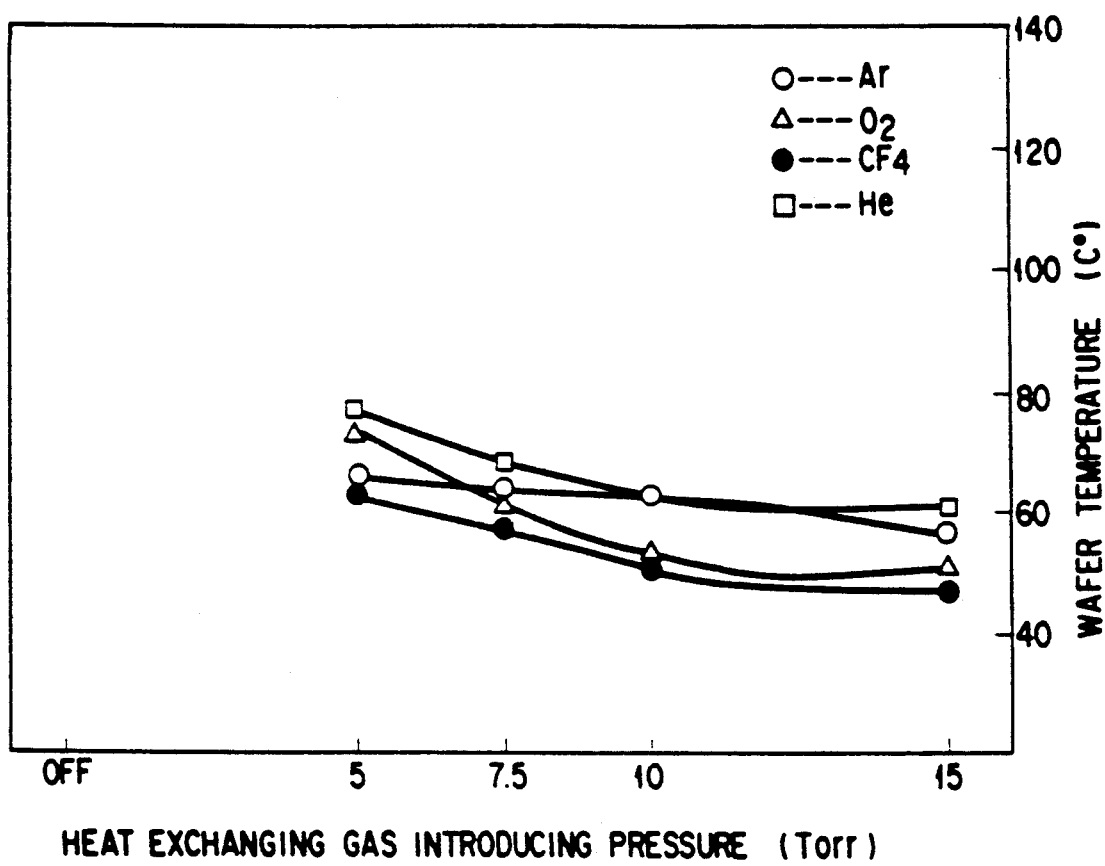
F I G. 5

METHOD OF ADJUSTING THE TEMPERATURE OF A SEMICONDUCTOR WAFER

BACKGROUND OF THE INVENTION

Field of the Invention

The present invention relates to a method of adjusting the temperature of a semiconductor wafer to desired process temperature in the wafer processing course and, more particularly, it relates to a method of introducing heat exchanging gas into an interstices (gap spaces) between the semiconductor wafer and a wafer-mounted table (susceptor) so as to transfer heat from the susceptor to the wafer through heat exchanging gas in the dry etching process.

Description of the Related Art

In the dry etching process, for example, etching gas is introduced between two opposed electrodes in a decompressing chamber to excite plasma and the semiconductor wafer is etched by the action of plasma thus excited. The semiconductor wafer is attracted and drawn on one of the electrodes by an electrostatic chuck. When the temperature of the semiconductor wafer is lowered in the dry etching process, there can be realized such etching that is excellent in etching anisotropy but that is quite little in micro-loading effect (effect of reducing etching depth to a greater extent as etching radius is made smaller and smaller). The susceptor must be cooled for this purpose, but when it is cooled, the heat exchanging rate between it and the wafer becomes low to thereby lower the wafer cooling rate.

This is because the wafer is partly contacted with the susceptor because of the unevenness of the underside of the wafer when viewed on a microscopic scale, and because interstices are thus created between them to insulate the wafer from the susceptor. In other words, the interstices between them acts as a vacuum heat insulating layer for the chamber is decompressed. As the result, the heat exchanging rate between them is lowered.

U.S. Pat. No. 4,457,359 discloses a technique of improving the heat exchanging rate between the wafer and the susceptor. According to this technique, helium gas is introduced into the interstices between the wafer and the susceptor to increase the heat exchanging rate between them. The reason why helium gas is used as heat exchanging gas is that helium gas is inactive and that influence added to the process can be made as little as possible even when helium gas is leaked into the chamber.

However, helium gas disturbs the state of plasma and influence thus added to the process is not little. In short, the plasma of process gas ($CF_4$ or $CHF_3$ gas) is made partly thin by gas leaked. Therefore, the density of plasma is not made uniform and the wafer etching rate becomes not uniform accordingly.

Further, helium gas is not necessarily excellent in heat exchanging characteristic because its heat capacity is relatively small.

SUMMARY OF THE INVENTION

The object of the present invention is therefore to provide a method of adjusting the temperature of a wafer whereby a gas which is more excellent in heat transmitting characteristic than helium gas and which adds quite little influence to the process even when it is leaked into the process area is used as heat exchanging gas.

As semiconductor devices are integrated higher and higher, it is needed these days that the accuracy of controlling the temperature of the wafer in the wafer process can be made higher. When helium gas is put sideways, argon gas is imagined at first as heat exchanging gas. According to tests conducted by the inventors, however, helium and argon gases are not substantially different in their heat transmitting characteristic, as shown in FIG. 5. Other inactive gases are of the rare type and it is therefore too high in cost to use a large amount of them as heat exchanging gas.

On the other hand, $O_2$ gas, although not of the inactive type, is also imagined. As shown in FIG. 5, it has been confirmed from the tests that the heat transmitting characteristic of $O_2$ gas is improved as compared with that of helium gas. However, $O_2$ gas is quite different in components from the process gas. When it is leaked into the process area, therefore, $O_2$ gas leaked will add a great influence to the wafer process, particularly in a case in the future where a more highly densified process will be needed.

Upon obtaining a desired heat exchanging characteristic while considering the influence added to the process when heat exchanging gas is leaked, it becomes unnecessary to select the heat exchanging gas under such a limited conventional condition that the heat exchanging gas must be of the inactive type. The range of gases selected according to every process, therefore, becomes wider. According to the above-mentioned tests conducted, it has been found that the heat transmitting characteristic of $CF_4$ gas is more excellent than that of helium gas when $CHF_3$ gas is used as the process gas for the dry etching process, for example.

According to an aspect of the present invention, there can be provided a method of adjusting the temperature of a semiconductor wafer comprising mounting and attracting the wafer on a susceptor in a process chamber; exhausting to decompress the process chamber; controlling the temperature of the wafer to a process temperature while cooling or heating the susceptor; introducing a process gas into the chamber to process the wafer; introducing a heat exchanging gas into interstices between the wafer and the susceptor through the susceptor to attain heat exchange between them; and whereby the heat exchanging gas includes same components as at least some of those of the process gas and its heat transmitting characteristic is more excellent than that of helium gas.

The above-mentioned heat exchanging gas includes no components which are different from those of the process gas. Even when the heat exchanging gas is leaked into the process chamber, therefore, the influence added to the process by the heat exchanging gas thus leaked is quite little When $CHF_3$ or $CF_4$ gas is used as the process gas in the dry etching process, for example, $CF_4$ gas is the most suitable for its being used as the heat exchanging gas.

It is preferable that the molecular weight of heat exchanging gas is larger than that of helium gas. This is because the heat transmitting characteristic of gas becomes more excellent as the molecular weight of it becomes larger.

It is optimum that those apertures in the top of the susceptor through which heat exchanging gas is introduced interstices between the wafer and the susceptor are positioned corresponding to the peripheral portion of the underside of the wafer. Further, it is preferable that the pressure under which heat exchanging gas is introduced is controlled to be in a range of 5-15 Torr. When the heat exchanging gas introducing pressure becomes smaller than 5 Torr., the scattering of gas into the interstices becomes insufficient so that the heat exchanging rate between the wafer and the table cannot be increased. When it becomes larger than 15 Torr, however, the wafer is caused to float from the susceptor. It is therefore needed that the heat exchanging gas introducing pressure is determined considering its balance relative to Coulomb force, for example, created by an electrostatic attracting sheet.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional block diagram schematically showing the etching apparatus in which the dry etching method according to a first embodiment of the present invention is employed;

FIG. 5 is a plot view showing how wafer temperatures measured are related to pressures under which various heat exchanging gases are supplied;

DETAILED DESCRIPTION OF THE PREFERRED EMBODIMENTS

Figure 2:
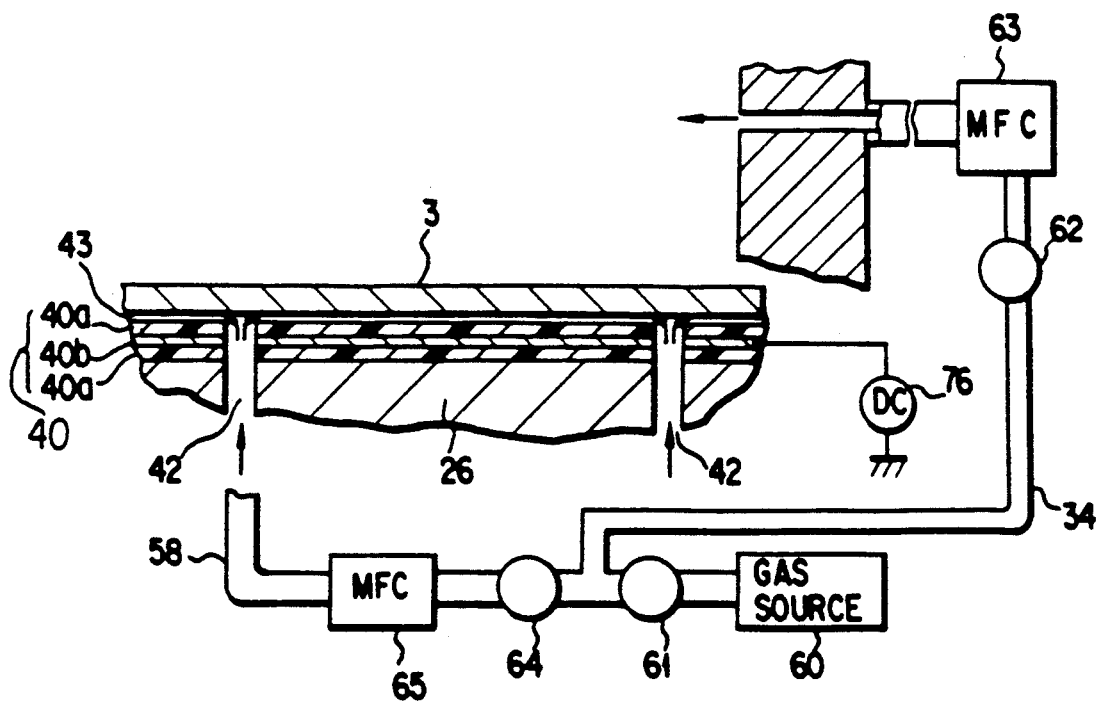
FIG. 2 is a vertically-sectioned view showing an upper portion of the susceptor enlarged.

Some dry etching methods of the present invention will be described with reference to the accompanying drawings.

FIG. 1 is a vertically-sectioned view schematically showing a magnetron plasma etching apparatus 8. This magnetron plasma etching apparatus 8 includes a reduced pressure chamber, a susceptor 4, an insulating section 5, a cooling jacket 6, a gas supply source 60, a magnet section 8 and an RF power source 9. Gas supply and exhaust pipes or conduits are communicated with the chamber. A semiconductor wafer 3 is mounted on the top of the susceptor 4, which is housed and made electrically floating in the ceramics-made insulating section 5. The cooling jacket 6 is contacted heat-exchangeable with the susceptor 4 through the insulating section 5. A magnet 52 for generating magnetic field is attached to a rotary disk 51 at the magnet section 8. The RF power source 9 is connected to the susceptor 4 via a rod electrode 53.

The reduced pressure chamber includes lower and upper chamber portions 21 and 22. The lower chamber portion 21 comprises a side wall 21a enclosing side walls of the support table housing section 5 and the liquid nitrogen housing section 6, and a bottom wall 21b for supporting the sections 5 and 6. The upper chamber portion 22 comprises a cylindrical side wall 22a enclosing the side wall 21a of the lower chamber portion 21, and a top wall 21b which serves as an upper electrode. The exhaust pipe 23 is connected to the lower portion of the side wall 22a of the upper chamber portion 22 and a vacuum pump (not shown) is connected to the exhaust pipe 23. When the vaccum chamber is exhausted by this exhaust means, therefore, it can be decompressed up to about $10^{-6}$ Torr. Another exhaust pipe 24 is connected to the bottom wall 21b of the lower chamber portion 21 and the reduced pressure chamber can also be exhausted through this exhaust pipe 24 by an exhaust means (not shown).

The susceptor 4 includes a lower member 25 and an upper member 26 detachably attached to the lower member 25. The upper member 26 has a disk-like projection 26a at the central portion thereof and an electrostatic attracting sheet 40 lies on the projection 26a. The wafer 3 is held onto the projection 26a, with the electrostatic attracting sheet 40 interposed between them, by Coulomb force. The electrostatic attracting sheet 40 comprises an insulating sheet 40a made of polyimide, for example, and a conductive sheet 40b made of copper and embedded in the insulating sheet 40a. The conductive sheet 40b in the insulating sheet 40a is connected to a DC power source (not shown).

The wafer 3 is mounted and attracted onto the electrostatic attracting sheet 40 on the first susceptor member 26. The electrostatic attracting sheet 40 is of such type that draws and hods the wafer to it by Coulomb force. The electrostatic chuck system of the monopole type, for example, is used in this case. In short, a conductive layer is interposed between two insulating sheets to form the electrostatic attracting sheet 40 and high voltage is applied to the conductive layer while the wafer is set to have different potential through plasma which will be described later. As the result, Coulomb force acts between them to attract each other.

The first susceptor member 26 is detachably fixed to the top of the second susceptor member 25. The reason why the susceptor is divided into two members in this manner is that only the first upper susceptor member 26 may be exchanged with a new one when the susceptor is contaminated. This makes it easier to maintain the susceptor.

The bottom and side walls of the first and second susceptor members 25 and 26 are covered by the ceramics-made insulating section 5. The liquid nitrogen housing section 6 which serves as the cooling jacket is arranged under the insulating section 5. The inner bottom face of the cooling jacket 6 is made porous to create nuclear boiling and liquid nitrogen in the cooling jacket 6 can be kept −196° C.

A ceramic heater 44 is embedded in the first susceptor member 26 This heater 44 serves to heat the too-cooled wafer 3. In short, the temperature of the water 3 can be micro-adjusted by the heater 44

The side wall and bottom of the susceptor 4 are covered by the insulating section 5 A clearance 29 is formed between the inner side wall face of the insulating section 5 and the susceptor 4 and an O-ring 30 seals the clearance 29 at the upper end of the susceptor 4. Another clearance 32 is formed between the inner face of the side wall 21a of the lower chamber portion 21 and the outer face of the side walls of the insulating section 5 and the cooling jacket 6 and an O-ring 33 seals the clearance 32 at the upper end of the insulating section 5. These O-rings 30 and 33 make the clearances 29 and 32 serve as vaccum heat insulating layers. These clearances 29 and 32 are exhausted through the exhaust pipe 24.

The RF power source 9 is connected to the upper susceptor member 26 through the conductive rod 53. The upper susceptor member 26 serves as a lower electrode. An insulating sleeve 54 into which the conductive rod 53 is inserted reaches the inner face of the top of the cooling jacket 6, passing through the bottoms of the lower chamber portion 21 and the cooling jacket 6. An O-ring 55 is interposed between the bottom 21b of the lower chamber portion 21 and the insulating sleeve 54 and another O-ring 56 between the insulating sleeve 54 and the conductive rod 53.

The top 22b of the upper chamber portion 22 is earthed and this top 22b and the support table 4 to which the RF power source 9 is connected and which serves as the lower electrode form a pair of parallel plate electrodes and electric field of high frequency is created between them.

The magnet section 8 includes the support member 51 arranged parallel just above the upper chamber member 22, the permanent magnet 52 supported by the support member 51, and a motor (not shown) for rotating the support member 5 and the permanent magnet 52 in a direction shown by X in FIG. 1. Parallel magnetic field can be thus uniformly created on the surface of the wafer. Orthogonal electro-magnetic fields are created between the top 22b of the upper chamber member 22 and the susceptor 4 by high frequency electric field and parallel magnetic field. Magnetron discharge can be thus realized.

As shown in FIG. 2, process and heat exchanging gases are supplied from a $CF_4$ gas supply source 60 in this case. A regulator 61 is attached to the gas supply source 60 to reduce gas pressure from 50 $kg/cm^2$ to 2 $kg/cm^2$. Another regulator 62 is attached to a pipe 34 on the process line to secondarily reduce gas pressure from 2 $kg/cm^2$ to 0.7 $kg/cm^2$. The flow rate of process gas supplied into the chamber is adjusted by a mass flow controller 63. A DC power source 76 is connected to a conductive layer 40b of the electrostatic attracting sheet 40.

A regulator 64 is attached to a conduit 58, through which heat exchanging gas is supplied to interstices 43, to decompress gas pressure from 2 $kg/cm^2$ to lower than 0.7 $kg/cm^2$. A sensor 68 is attached to the conduit 58 and it is connected to the input of a controller 69, as shown in FIG. 1. A regulator 64 and MFC 65 are controlled responsive to detection signals applied from the sensor 68.

A through-hole is passed through the first and second susceptor members 26 and 25, the insulating ceramic 5, and the liquid nitrogen containing section 6 to form a conduit 58. Interstices 43 exist between the wafer 3 and the electrostatic attracting sheet 40 because the underside of the wafer 3 is uneven when seen on a microscopic scale. The interstices 43 lowers the heat exchanging efficiency to thereby cause the temperature distribution all over the wafer 3 not to become uniform. When the interstices 43 is filled with heat exchanging gas having a certain pressure and supplied through the conduit 58, however, the temperature distribution can be made uniform all over the wafer 3. As shown in FIG. 2, the sheet 40 for electrostatically attracting the wafer 3 on the first susceptor member 26 has gas introducing apertures 42 which are formed along a peripheral portion of the sheet 40 at a certain interval to correspond to the peripheral portion of the underside of the wafer 3. Heat exchanging gas supplied through the conduit 58 is therefore introduced under the certain pressure into the interstices 43 through the gas introducing apertures 42.

Figure 3:
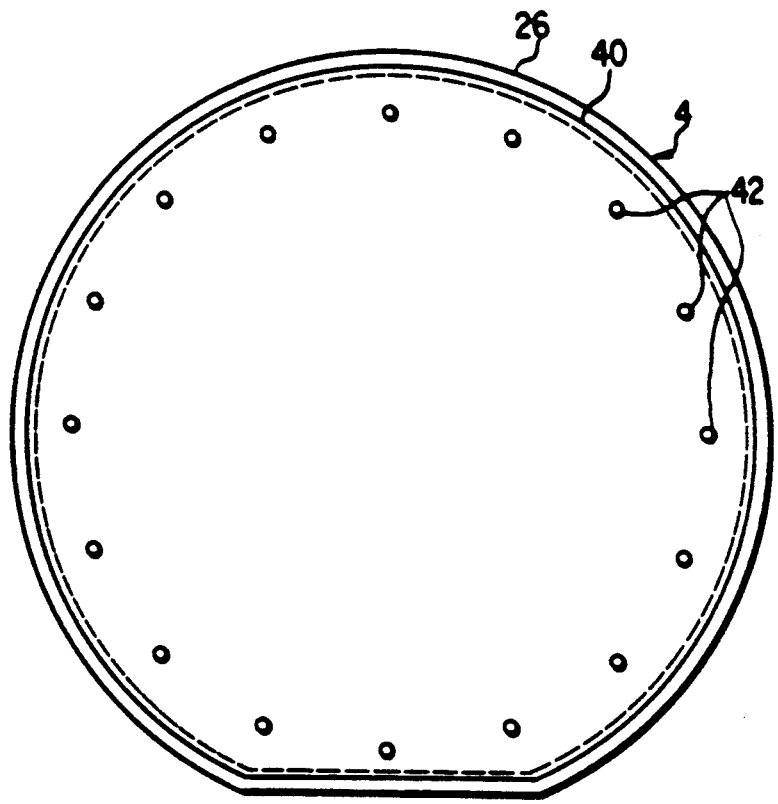
FIG. 3 is a plan view showing the top of the susceptor.

As shown in FIG. 3, sixteen apertures 42 are formed along the peripheral portion of the electrostatic attracting sheet 40 at same interval. Heat exchanging gas is introduced into the interstices 43 through these apertures 42. Each of the apertures 42 is communicated with a passage 57 through a header 41, as shown in FIG. 1. That portion of each of the apertures 42 which is opened at the top of the electrostatic attracting sheet 40 has a diameter of 0.8 mm and it is separated from the outer rim of the sheet 40 by 8–10 mm.

Figure 4:
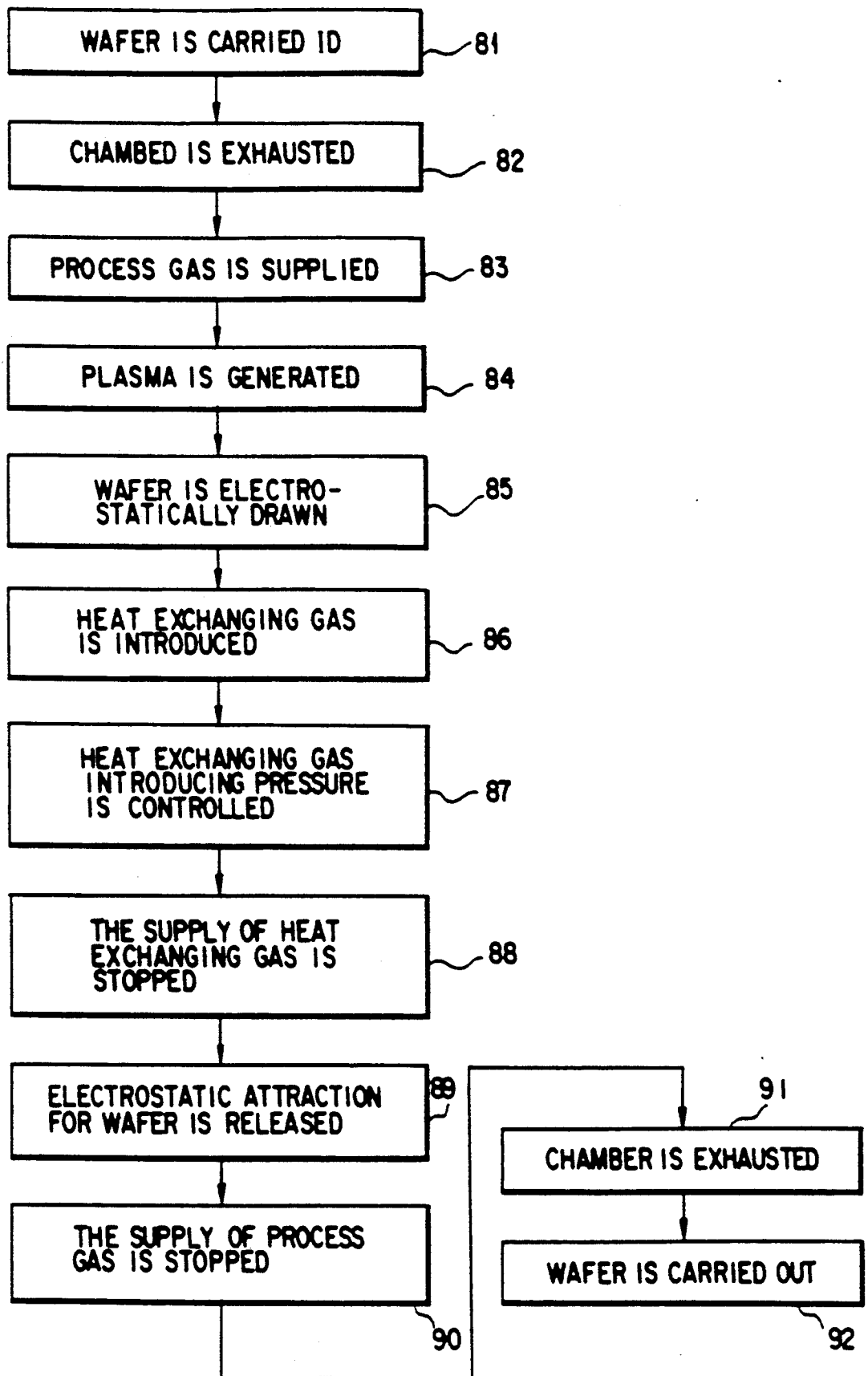
FIG. 4 is a flow chart showing how the dry etching method is carried out.

Referring to FIG. 4, it will be described how the semiconductor wafer is dry-etched.

The silicon wafer 3 of eight-inch diameter is carried into the chamber and mounted on the susceptor 4 (Step 81). The gate (not shown) through which the wafer 3 is carried into and out of the chamber is closed and the chamber is then exhausted to have a certain basic pressure in it (Step 82).

When it is detected that the chamber is decompressed to the certain basic pressure, signals are sent from the controller 69 to the pressure adjusting valves 61, 62 and the MFC 63 to supply $CF_4$ gas into the chamber through the pipe 34 (Step 83). $CF_4$ gas is introduced into the chamber at a flow rate of 50 SCCM. The exhaust conductance is adjusted this time to keep chamber pressure at about 40 mTorr.

Etching gas is introduced into plasma creating area through the pipe 34, an opening 35, a space 36 and scattering holes 37. High frequency power is supplied under this state from the RF power source 9 to between the top 22b of the upper chamber portion 22 and the susceptor 4. Parallel magnetic field is applied from the magnet 52 to between the electrodes and orthogonal electromagnetic fields are thus formed on the surface of the wafer 3. This enables magnetron discharge to be created against the surface of the wafer 3. As the magnet 52 is being rotated, this magnetron discharge can be uniformly excited. In the case of this magnetron discharge, electrons present between the electrodes play cyclone movement to collide against molecules. The times at which molecules are ionized are thus increased and a high etching speed of 1 μm/min can be therefore achieved even when the pressure is relatively low or in a range of $10^{-2}$–$10^{-3}$ Torr. The magnetron discharge enables the etching not only to be made under low pressure but also to have a more excellent anisotropy. RF power is supplied between the upper chamber portion 22 and the first susceptor member 26 in this manner and plasma of high density is generated while rotating the magnet 52 (Step 84).

High voltage is applied to the electrostatic attracting sheet 40 and Coulomb force is thus created between the wafer 3 and the sheet 40 to electrostatically attract and draw the wafer 3 to the sheet 40 (Step 85).

The wafer 3 receives the radiation heat to plasma to thereby raise its temperature in the course of the dry etching process. The wafer 3 must be therefore cooled to enhance etching characteristics. Liquid nitrogen 47 is thus circulated through the cooling jacket 6 to cool the susceptor members 25 and 26. In addition, the upper susceptor member 26 is heated by the heater 44 to micro-adjust the temperature of the wafer 3. The cooling temperature is set to control the lower susceptor member 25 to a temperature of 20° C. Signals are applied this time from the controller 69 to the valve 64 and the MFC 65 to supply $CF_4$ gas into the conduit 58. $CF_4$ gas is introduced into the interstices 43, passing through the passage 57, the header 31 and the apertures 42 (Step 86).

$CF_4$ gas in the interstices 43 flows from the rim portion of the underside of the wafer 3 toward the center thereof. When $CF_4$ gas is scattered in the whole of the interstices 43, heat exchanging rate between the wafer 3 and the susceptor 4 is increased. The pressure under which $CF_4$ gas is introduced is controlled to be a desired value within a range of 1-30 Torr at the sesor 68 (Step 87). When the gas introducing pressure becomes smaller than the smallest value in this range, gas is insufficiently scattered in the interstices 43. When it becomes larger than the largest value in the range, however, the wafer 3 is caused to depart from the top of the susceptor 4. It is therefore needed that the gas introducing pressure is determined considering how this pressure is balanced Coulomb force applied from the electrostatic attracting sheet 40.

The electrostatic attracting sheet 40 of the susceptor 4 exchanges heat with the wafer 3 through $CF_4$ gas introduced. Even when this heat exchanging gas is leaked into the process area, it does not add any bad influence to the etching because it is also used as process gas in this case.

When a certain time period is passed after the start of the etching process, the introduction of heat exchanging gas is stopped (Step 88). Power supply to the sheet 40 is then stopped to release the wafer 3 from its being electrostatically attracted by the susceptor 4 (Step 89). The supply of process gas is stopped to finish the dry etching process (Step 90). Gas remaining in the chamber is exhausted (Step 91). The gate of the chamber is opened to allow the wafer 3 to be carried out of the chamber (Step 92).

FIG. 5 is a plot diagram showing how wafer temperatures measured are related to heat exchanging gas supply pressures set when the heat exchanging gas used is variously changed under the above-mentioned process conditions. Paint circles in FIG. 5 denote results obtained relating to $CF_4$ gas (in the first embodiment of the present invention), blank rectangles those obtained relating to helium gas (in a comparison example), blank circles those obtained relating to argon gas (in another comparison example), and blank triangles those obtained relating to oxygen gas (in a further comparison example). Temperature was measured at the center portion of the wafer 3. As shown in FIG. 5, the heat exchanging efficiency of $CF_4$ gas is the most excellent as compared with those of helium, argon and oxygen gases.

As apparent from FIG. 5, too, the temperature of the wafer 3 can be made lower as the gas introducing pressure becomes higher. The heat exchanging gas introducing pressure is usually selected from, values in a range of 1-30 Torr. This is because a desired heat exchanging rate cannot be obtained when the pressure becomes smaller than 1 Torr. This is also because the wafer 3 is caused to float from the susceptor 4 against Couomb force applied from the sheet 40 when the pressure becomes larger than 30 Torr. In other words, electrostatic attraction force applied from the sheet 40 to the wafer 3 is reduced, thereby causing the heat exchanging gas introducing pressure to exceed this force, when dust and particles are present, even if a little, in the interstices 43. In addition, the amount of gas leaked from the interstices 43 into the chamber increases more and more as the gas introducing pressure becomes larger. It is therefore preferable in this case that the pressure is controlled to be in a range of 5-15 Torr. As apparent from data shown in FIG. 5, too, it is preferable to set the pressure in a range of 7.5-15 Torr. The heat exchanging rate between the wafer and the susceptor under this pressure range can be kept substantially unchanged.

Description will be made about the leakage of heat exchanging gas.

Although extremely fine on a microscopic scale, a gap exists between the wafer 3 and the electrostatic attracting sheet 40 along their circumferential rim portion. Heat exchanging gas leaks process area through this interstices 43. Heat exchanging gas is same as etching gas in the case of this embodiment. Even when heat exchanging gas is leaked, therefore, any influence is not added to the etching process. In the case where heat exchanging gas is leaked and made plasma in the chamber, ions in the plasma can have same components as those obtained when etching gas is made plasma. In addition, $CF_4$ gas produces no component deposited. This prevents the wafer 3 and the inner will face of the chamber from being contaminated.

Referring to FIGS. 6 through 9, it will be described how the temperature of wafer is changed when those positions at which heat exchanging gas is introduced are changed.

Figure 6:
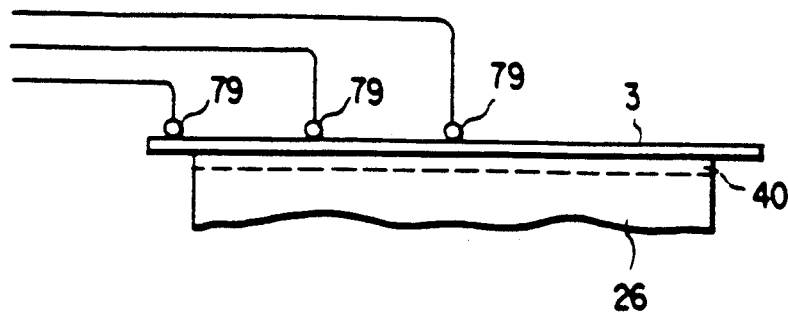
FIG. 6 shows those positions at which the temperature of wafer is measured.

As shown in FIG. 6, temperature detecting terminals 79 were arranged at the peripheral, middle and center portions of the top of the wafer 3 and the temperature of the wafer 3 was adjusted while variously changing, under the above-mentioned process conditions in the first embodiment, the pressure under which heat exchanging gas was supplied.

Figure 7:
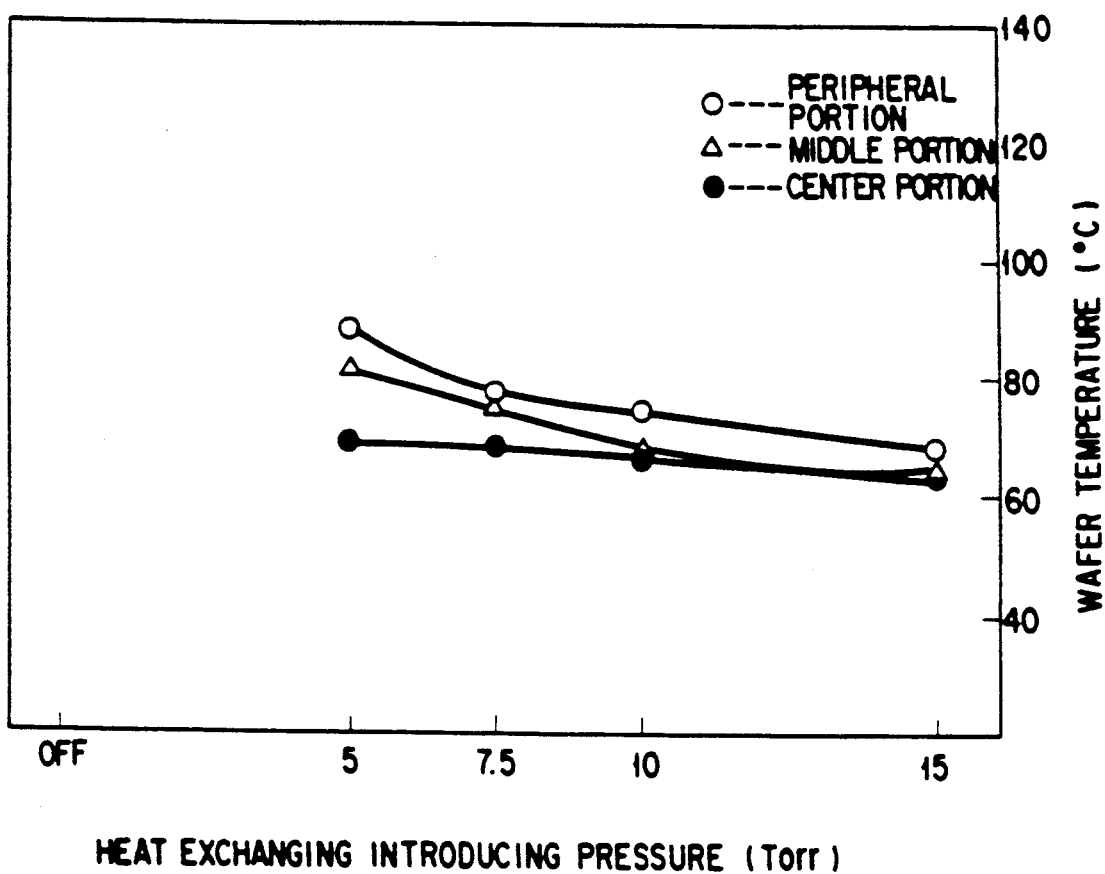
FIG. 7 is a plot view showing how wafer temperatures measured are related to pressures under which heat exchanging gas is supplied when those positions at which the temperature of a wafer is measured are changed.

In FIG. 7, pressures under which heat exchanging gas is introduced are plotted on the horizontal axis and temperatures of wafer on the vertical axis. FIG. 7, therefore, is a plot diagram showing how gas introducing pressures are related to temperatures of wafer when they are measured using the susceptor 4. In FIG. 7, blank circles denote results obtained at the peripheral portion of the wafer, blank triangles those obtained at the middle portion thereof, and paint circles those obtained at the center portion thereof. As apparent from FIG. 7, temperature difference between values obtained at the peripheral and center portions of the wafer becomes smaller as the gas introducing pressure is made larger. When the gas introducing pressure is made 5

Torr, the temperature difference is 20° C., but when it is made 15 Torr, the temperature difference is smaller than 10° C.

Figure 8:
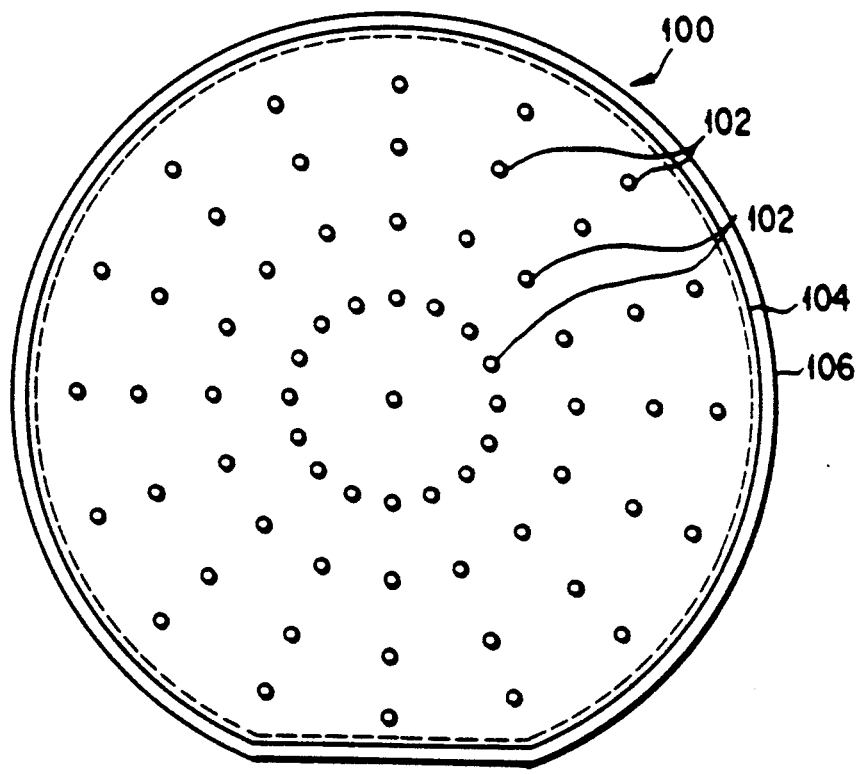
FIG. 8 is a plan view showing the conventional susceptor.

In the case of a susceptor 106 of a conventional etching apparatus 100, gas introducing openings 102 are arranged almost all over an electrostatic attracting sheet 104, as shown in FIG. 8. The temperature of the wafer 3 was adjusted, using the susceptor 106 while variously changing, under the above-mentioned process conditions, the pressure under which heat exchanging gas was supplied.

Figure 9:
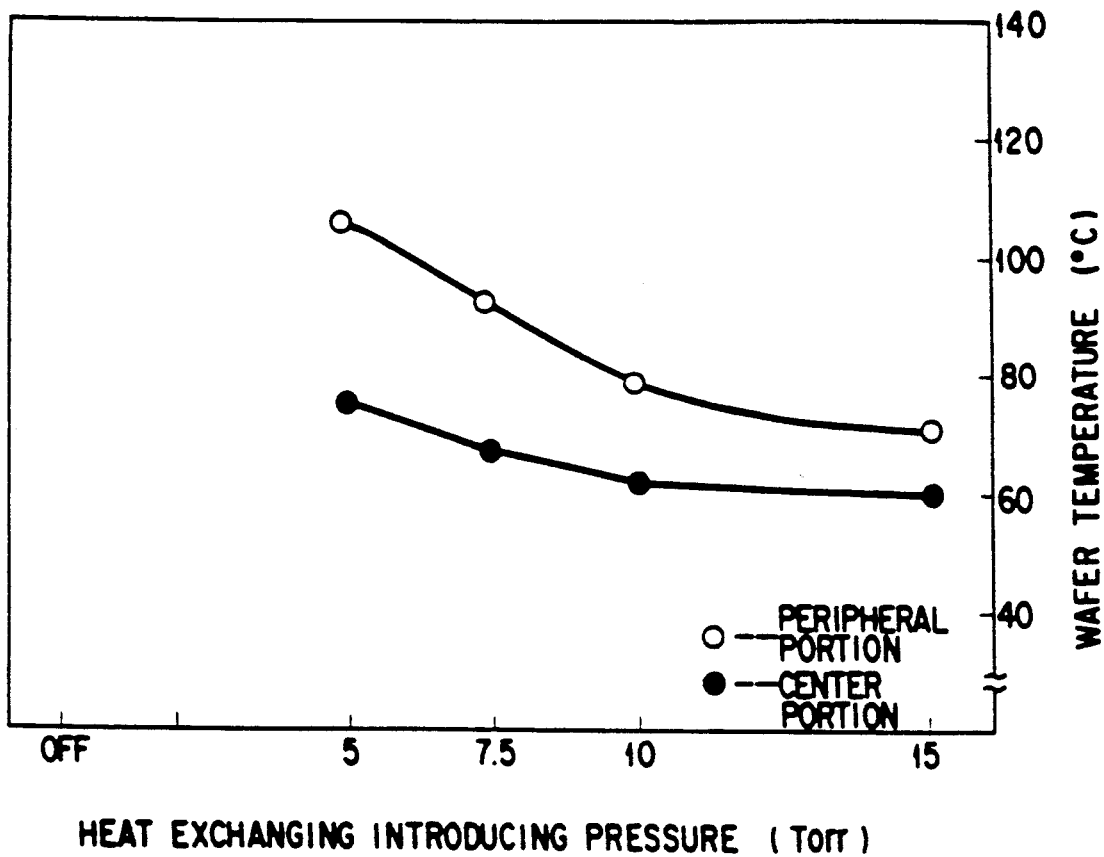
FIG. 9 is a plot view showing how wafer temperatures measured are related to pressures under which heat exchanging gas is supplied when the conventional susceptor is used.

Plotting gas introducing pressures on the horizontal axis and wafer temperatures on the vertical axis, FIG. 9 shows how both of them are related to each other when they are measured using the susceptor 106. In FIG. 9, black circles represent results obtained at the peripheral portion of the wafer 3 and paint circles those obtained at the center portion thereof. As apparent from FIG. 9, temperatures obtained at the peripheral portion of the wafer and at the center portion thereof become different, ranging even from 10°-40° C. Further, electrostatic attraction force applied to the center portion of the wafer is reduced according to the conventional susceptor 106 shown in FIG. 8. It is therefore dangerous that the gas introducing pressure is increased.

According to the susceptor 4 shown in FIG. 3, however, heat exchanging gas is introduced into the interstices 43 under and along the peripheral portion of the underside of the wafer 3, passing through the apertures 42. Heat exchanging gas is then spreaded under the whole of the underside of the wafer 3 so that a desired heat exchanging rate can be achieved between the wafer and the susceptor. Further, a desired electrostatic attraction force can be applied to the wafer 3 because no gas introducing aperture is provided at the center portion of the wafer 3.

As apparent from FIGS. 7 and 9, the uniformity of temperature distribution on the wafer 3 can be enhanced to a greater extent in the case of the first embodiment than in the case of the conventional method. As the result, the etching process can be made more uniform in the wafer 3 in the case of the first embodiment.

Figure 10:
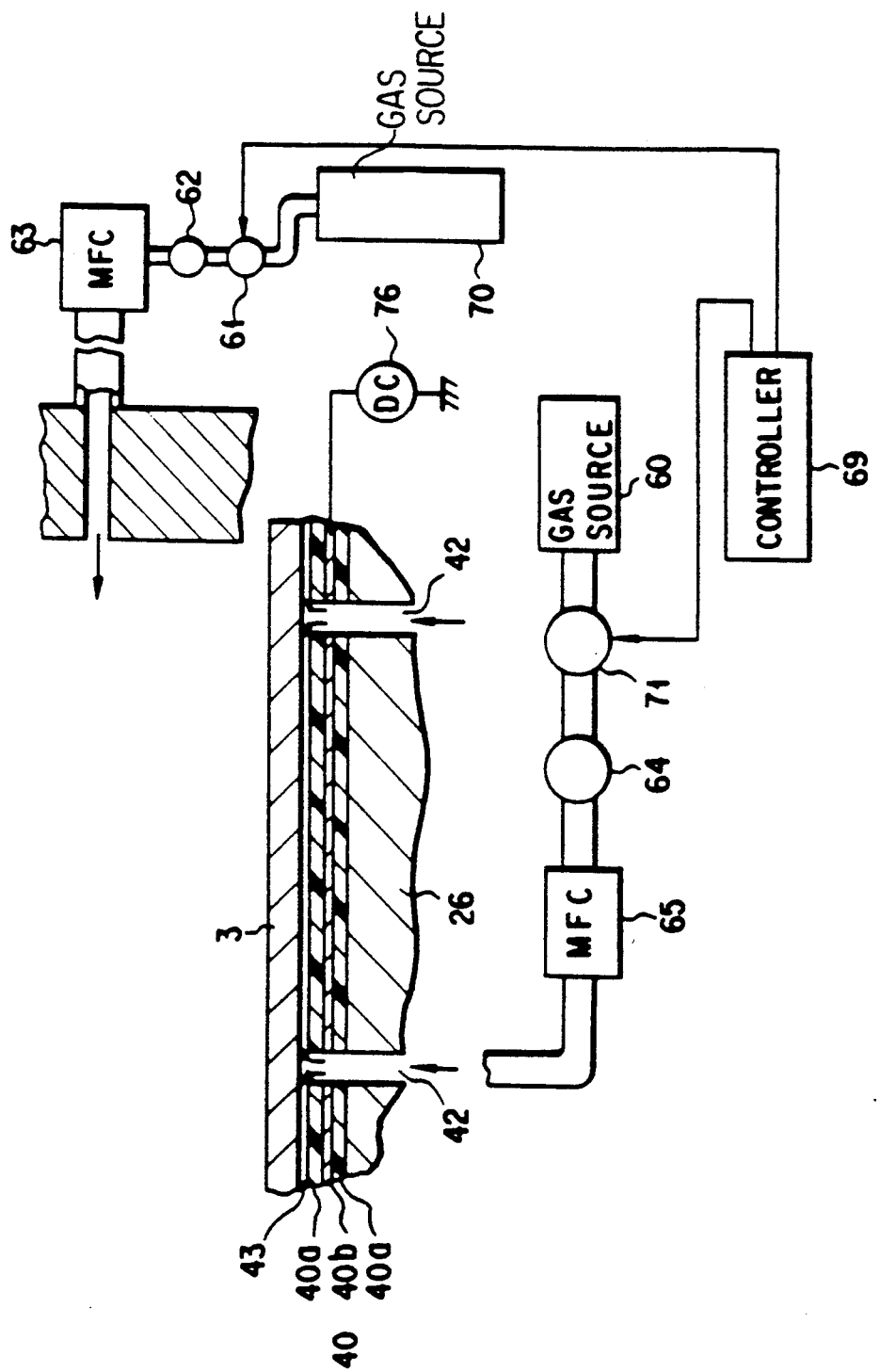
FIG. 10 is a sectional block diagram showing a part of the etching apparatus in which the dry etching method according to a second embodiment of the present invention is employed.

A second embodiment of the present invention will be described with reference to FIG. 10. Description on same components as those in the first embodiment will be omitted.

$CHF_3$ is used as etching gas and $CF_4$ gas as heat exchanging gas in the second embodiment. Etching and heat exchanging gas supply sources 60 and 70 are provided independent of the other and $CHF_3$ gas is supplied from the etching gas supply source 70 into the chamber while $CF_4$ gas from the heat exchanging gas supply source 60 into the interstices 43. Regulators 61 and 71 attached to both gas sources 60 and 70 are controlled by the controller 69.

Consideration will be paid to the leakage of heat exchanging gas.

$CF_4$ gas having components almost similar to those of $CHF_3$ gas which is used as etching gas is used as heat exchanging gas in the second embodiment. Even when $CF_4$ gas is leaked, therefore, any substantial influence is not added to the etching process. In the case where the heat exchanging gas is leaked and made plasma in the chamber, ions in the plasma can have same components as those of ions created when the etching gas is made plasma Further, $CF_4$ gas creates no components deposited and this prevents the wafer 3 and the inner wall face of the chamber from being contaminated. When $CF_4$ gas is compared with $CHF_3$ gas in this point, the latter is likely to produce components deposited because it contains hydrogen in its components.

Although $CHF_3$ gas has been used as etching gas and $CF_4$ gas as heat exchanging gas in the second embodiment, the present invention is not limited to these gases. $Cl_2$ gas may be used as etching and heat exchanging gases. Or $SF_6$ gas may be used as etching and heat exchanging gases. In other words, any of gases which are higher in heat exchanging rate than helium gas and which have same components as at least some of those of the etching gas may be used as heat exchanging gas.

When plural process gases are used, any of gases which have same components as at least some of those of the plural process gases and which are higher in heat exchanging rate than helium gas may be used as heat exchanging gas.

Although the dry etching process has been cited in the above described embodiments, the present invention may be applied to the sputtering, ions-injecting, decompressing CVD processes.

Although the electrostatic attracting sheet has been used as the chuck means for holding and fixing the semiconductor wafer on the susceptor, other means such as the mechanical clamp may be used.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of adjusting the temperature of a semiconductor wafer, comprising the steps of:
   mounting and attracting the wafer on a susceptor in a process chamber;
   exhausting the process chamber so as to decompress in the process chamber;
   controlling the temperature of the wafer to become equal to a process temperature while cooling or heating the susceptor;
   supplying into the process chamber an etching gas capable or performing a reactive ion etching function relative to the wafer;
   introducing a heat exchanging gas into interstices between the wafer and the susceptor through the susceptor, said heat exchanging gas
   containing component equal to that to the etching gas, being superior to helium gas in heat conductivity, having a molecular weight larger than that of helium, and serving to exchange heat between the wafer and the susceptor.

2. The method according to claim 1, wherein said wafer is attracted onto the susceptor by an electrostatic force, and said heat exchanging gas is supplied through openings of the susceptor toward the peripheral portion of the wafer such that the heat exchanging gas flows through said interstices.

3. A method of adjusting the temperature of a semiconductor wafer, comprising the steps of:
   mounting the wafer on a susceptor in a process chamber;
   attracting the wafer to the susceptor by an electrostatic force;

exhausting the process chamber so as to decompress in the process chamber;

controlling the temperature of the wafer to become equal to a process temperature while cooling or heating the susceptor;

supplying an etching gas into the chamber to process the wafer;

introducing a heat exchanging gas into interstices between the wafer and the susceptor through openings of the susceptor such that said heat exchanging gas flows toward the peripheral portion of the wafer, said heat exchanging gas containing a component equal to that of said etching gas, being superior to helium gas in heat conductivity, having a molecular weight larger than that of helium, and serving to exchange heat between the wafer and the susceptor.

4. The method according to claim 2, wherein said openings in said susceptor toward the peripheral portion of the wafer are the only openings in the susceptor.

5. The wafer temperature adjusting method according to claim 1, wherein said heat exchanging gas consists of the same components as those of the etching gas.

6. The wafer temperature adjusting method according to claim 1, wherein gas which comprises carbon and fluorine components is used as the etching gas and $CF_4$ gas is used as the heat exchanging gas.

7. The wafer temperature adjusting method according to claim 6, wherein $CF_4$ gas is used as the etching gas.

8. The wafer temperature adjusting method according to claim 1, further comprising controlling the pressure under which the heat exchanging gas is introduced into the interstices.

9. The wafer temperature adjusting method according to claim 8, wherein the pressure under which the heat exchanging gas is introduced is controlled to be in a range of 5-15 Torr.

10. The wafer temperature adjusting method according to claim 1, wherein said etching gas and said heat exchanging gas are supplied from a same gas supply source into the process chamber and into the interstices, respectively.

* * * * *